United States Patent [19]

Sanwo et al.

[11] Patent Number: 4,785,205

[45] Date of Patent: Nov. 15, 1988

[54] HIGH SPEED ECL TO CMOS CONVERTER

[75] Inventors: Ikuo J. Sanwo, San Marcos; Mukesh B. Suthar, Sunnyvale, both of Calif.

[73] Assignee: NCR Corporation, Dayton, Ohio

[21] Appl. No.: 67,348

[22] Filed: Jun. 29, 1987

[51] Int. Cl.[4] .................. H03K 17/16; H03K 19/017; H03K 19/092
[52] U.S. Cl. .................... 307/475; 307/443; 307/448; 307/451
[58] Field of Search ............... 307/475, 443, 448, 451

[56] References Cited

U.S. PATENT DOCUMENTS 4,408,136  10/1983  Kirsch .................................. 307/475
4,678,950  7/1987   Mitake ................................. 307/475

FOREIGN PATENT DOCUMENTS 0072429  5/1982  Japan ................................. 307/448

Primary Examiner—John S. Heyman
Assistant Examiner—M. R. Wambach
Attorney, Agent, or Firm—Wilbert Hawk, Jr.; Edward Dugas; Jack R. Penrod

[57] ABSTRACT

An ECL to CMOS converter which connects the ECL input signal directly to the source electrode of a MOS gate, and the gate electrode of the MOS gate is independently regulated by connection to a reference voltage that is current sinked through a D.C. path to the negative CMOS voltage supply terminal. The drain electrode of the MOS gate is connected to the input of a CMOS inverter to provide the necessary logic level shift. Another MOS gate provides a D.C. signal path by connecting the input of the CMOS inverter to the negative CMOS voltage supply terminal.

6 Claims, 2 Drawing Sheets

HIGH SPEED ECL TO CMOS CONVERTER

BACKGROUND OF THE INVENTION

The subject matter of the present invention relates generally to circuitry for converting ECL logic level signals to corresponding CMOS logic level signals to permit the coupling of ECL circuits to CMOS circuits and to interface with logic circuit buffer drivers of the type that are used in networks where matched impedance terminated transmission line communications is required.

In order to couple an ECL circuit to a CMOS circuit, the difference between the output voltages from the first circuit and the input voltages needed by the second circuit, must be generated by some form of converter circuit.

In ECL circuits, the logic level "1" will approach $-0.8$ volts while the logic level "0" will approach $-1.68$ volts. For CMOS circuits, the logic level "1" will approach the power supply value, which is generally 3 to 5 volts, while the logic level "0" will be near the reference or ground level voltage.

Circuitry for performing such a conversion should contain as few transistors as possible in order to minimize the use of silicon area and also to minimize propagation delays through the transistors.

A patent of interest for its teaching in this art is U.S. Pat. No. 4,453,095, entitled "ECL MOS Buffer Circuits" by R. S. Wrathall. The circuit described in this patent is an input buffer for receiving on its input ECL logic signals and for providing at its output, CMOS signals.

Another patent of interest is U.S. Pat. No. 4,538,076, entitled "Level Converter Circuit" by H. Shinada. The circuit of this patent is a level converter for converting a first logic signal, using a lower voltage supply as a base potential, into a second logic signal having a higher voltage supply as a base potential.

Another patent of interest is U.S. Pat. No. 4,568,601, entitled "Level Conversion Input Circuit" by N. A. Kokubungi et al. The circuit of this patent converts an ECL logic level signal to a CMOS logic level signal. The circuit is adapted to provide a level conversion input which has high speed performance and low power consumption while being relatively stable as to the fluctuation of temperature and power source voltages.

Another patent of interest is U.S. Patent No. 4,437,171, entitled "ECL Compatible CMOS Memory" by E. L. Hudson et al. In this patent input buffers are provided with a comparator that is referenced to a biasing potential. The biasing potential is developed on the CMOS chipwwith bi-polar transistors, integrally formed during the CMOS processing. The comparator outputs the difference in the level of the ECL input signal as compared against the biasing network voltage, and by level shifting the difference between the signals provides the appropriate CMOS logic level signal.

SUMMARY OF THE INVENTION

In the present invention, the ECL to CMOS converter performs by having the ECL input signal applied to the source of a P-channel MOS transistor. The threshold of the transistor (gate input) is independently regulated by a reference voltage. An N-channel MOS transistor is connected to the drain of the P-channel MOS transistor to provide a D.C. path to the VEE node of the circuit.

More specifically, there is provided a first MOS gate, of first conductivity type, having source, drain, and gate electrodes, with the source electrode connected to receive the ECL logic level signal. A second MOS gate, of first conductivity type, having source, drain, and gate electrodes, is connected such that the drain electrode is connected to the gate electrode and the source electrode is connected to a biasing voltage. Also provided is a first and a second power terminal having voltage levels thereat corresponding to the high and the low CMOS logic levels, respectively. A current sink is connected between the drain and the gate electrode of the second MOS gate and the second power terminal. A third MOS gate, of second conductivity type, having source, drain, and gate electrodes, has the drain electrode connected to the drain electrode of the first MOS gate, and its source electrode connected to the second power terminal, and the gate electrode connected to the first power terminal. An inverter circuit is connected between the first and the second power terminals with the inverter circuit having an input that is connected to the drain of the first MOS gate and an output which provides the CMOS logic level signals in response to the ECL logic level signals at the source of the first MOS gate.

From the foregoing, it can be seen that it is a principal object of the present invention to provide an improved ECL to CMOS converter.

It is another object of the present invention to provide a circuit wherein key MOS gates are sized such that process variations and temperature fluctuations influence the transistors equally.

The aforementioned objects and features of the present invention will become more apparent when taken in conjunction with the following description and drawings wherein like characters indicate like parts and which drawings form a part of the present disclosure.

DESCRIPTION OF THE PREFERRED EMBODIMENT

Figure 1:
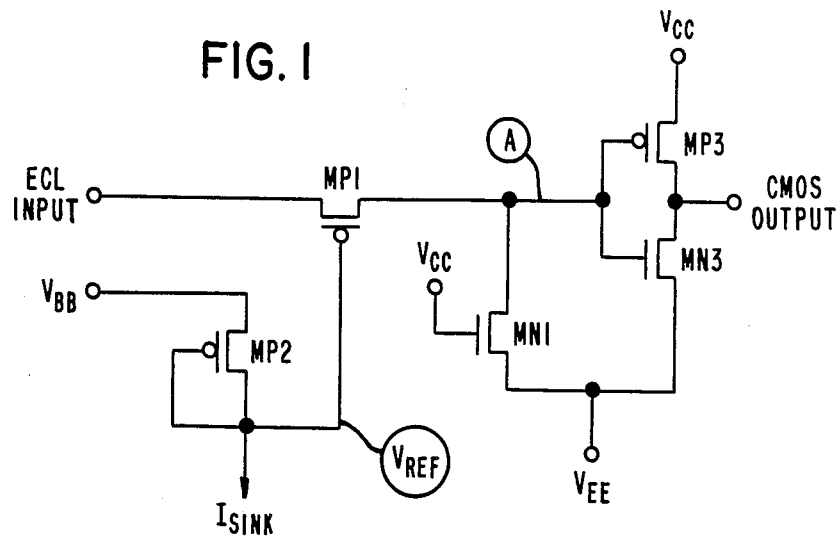
FIG. 1 is a circuit diagram of the preferred embodiment of the invention.
Figure 2:
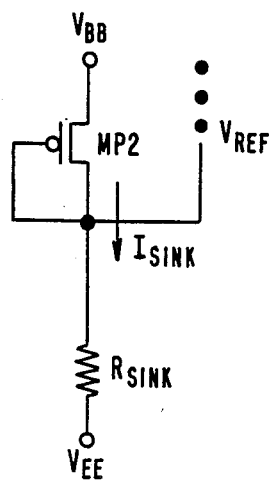
FIG. 2 is a circuit diagram of a current sink which may be used in conjunction with the circuit of FIG. 1.
Figure 3:
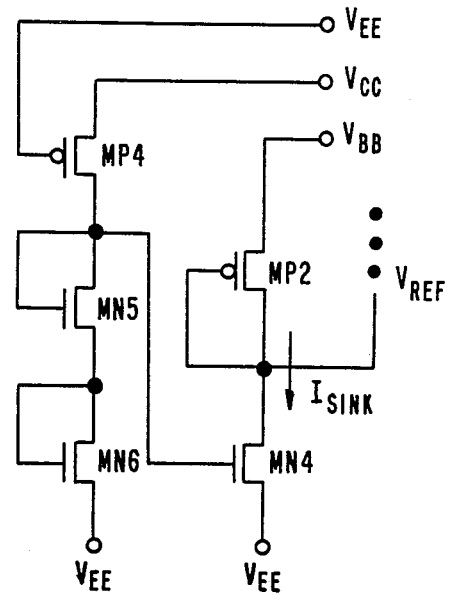
FIG. 3 is a alternate circuit embodiment of a current sink that may be used in conjunction with the circuit of FIG. 1.

Referring to FIG. 1, a P-channel MOS transistor gate MP1 is connected between an input terminal and an output terminal by a CMOS inverter comprised of a P-channel MOS transistor gate MP3 and an N-channel MOS transistor gate MN3. The gate electrode of the transistor MP1 is connected to a reference potential VREF. A P-channel MOS transistor gate MP2 has its source electrode connected to a biasing voltage VBB, which in the preferred embodiment of the invention is $-1.29$ volts. The gate electrode of transistor MP2 is connected to its drain electrode and to the gate electrode of transistor MP1. In addition, the drain electrode of transistor MP2 is connected to a current sink. The current sink functions to provide a D.C. path to a CMOS voltage potential VEE, which in the preferred embodiment is −5.2 volts. Two implementations of a current sink are shown in FIGS. 2 and 3.

An N-channel MOS transistor gate MN1 provides a D.C. path from the drain electrode of transistor MP1 to the voltage potential VEE by connecting the drain electrode of transistor MN1 to the drain electrode of transistor MP1 and the gate electrode of transistor MN1 to a CMOS potential VCC, which in the preferred embodiment is 0 volts. The inverter switches between the voltage levels VCC and VEE in response to the level of the signal on the gate electrodes of transistors MP3 and MN3. The source and drain electrodes of transistors MN3 and MP3, respectively, are connected to the output terminal of the circuit. The source electrode of MP3 is connected to the potential VCC, and the drain electrode of transistor MN3 is connected to the potential VEE.

The reference voltage VBB is applied such that transistor gate MP1 switches at the input voltage threshold for ECL logic signals. Therefore, the voltage required is:

$$V_{ref} = V_{bb} + V_{th(p)}$$

where, $V_{bb}$, is equal to $\frac{1}{2}(V_{il} + V_{ih})$
$V_{th(p)}$, is the threshold voltage of transistor MP1

If transistor MP2 is sized the same as transistor MP1, process variations and temperature fluctuations effecting MP1 will also influence MP2 equally.

The determining ratio for the sizes of MP1 and MN1, using first order approximations, is described by:

$$\frac{W_n/L_n}{W_p/L_p} > \frac{u_p |V_{bb} - V_{ih}|}{u_n |V_{sg(n)} - V_{th(n)}|}$$

where, $W_P$, is the channel width of transistor MP1
$L_P$, is the channel length of transistor MP1
$W_n$, is the channel width of transistor MN1
$L_n$, is the channel length of transistor MN1
$V_{bb}$, ECL reference voltage [ECL -> −1.29 v]
$V_{ih}$, ECL high level input voltage [ECL -> −0.8 v] $V_{sg(n)}$, is the source to gate voltage of transistor MN1 $u_p$, is the hole mobility of transistor MP1 $u_n$, is the electron mobility of transistor MN1 $V_{th(n)}$, is the voltage threshold of transistor MN1

* Ref: "Principles of CMOS VLSI Design", Neil Weste, Kamran Eshraghian, Addision Wesley Publ. Co. Pg. 39.

In operation, of the circuit of FIG. 1, for the state when the voltage level of the logic signal on the input is above VBB, transistor MP1 is on, thereby pulling the node labeled with a circled A, at the juncture of the drains of transistors MP1 and MN1, towards the input voltage level. This counters the effect of transistor MN1 which is trying to pull the node A voltage to the level of VEE. With the MP1/MN1 size ratio chosen, as disclosed above, the node A voltage will be high. The voltage at the circuit output will therefore be low due to the action of the inverter. When the logic level of the input signal falls below VBB, transistor MP1 will turn off. At that time, transistor MN1 will provide a discharge path for node A to VEE. Node A will then be low and the voltage at the circuit output will therefore be high.

Referring now to FIG. 2, one form of a current sink that may be used with the circuit embodiment of FIG. 1 is a resistance path from the drain electrode of the transistor MP2 to the potential VEE. In the preferred embodiment, the resistor in the resistance path has a value of 3.9K.

A second version of a current sink, disclosed in FIG. 3 and is comprised of an N-channel MOS transistor gate MN4 having its drain electrode connected to the drain electrode of transistor MP2 and its source electrode connected to the potential VEE. A turn on gate potential is generated for gate MN4 by a circuit connected between the voltage potential VCC and VEE. The circuit is comprised of a P-channel MOS transistor gate MP4 and two serially connected N-channel MOS transistor gates MN5 and MN6. The gate electrodes of transistors MN5 and MN6 are shorted to their respective drain electrodes. The gate electrode of transistor MP4 is connected to the voltage potential VEE.

Figure 4:
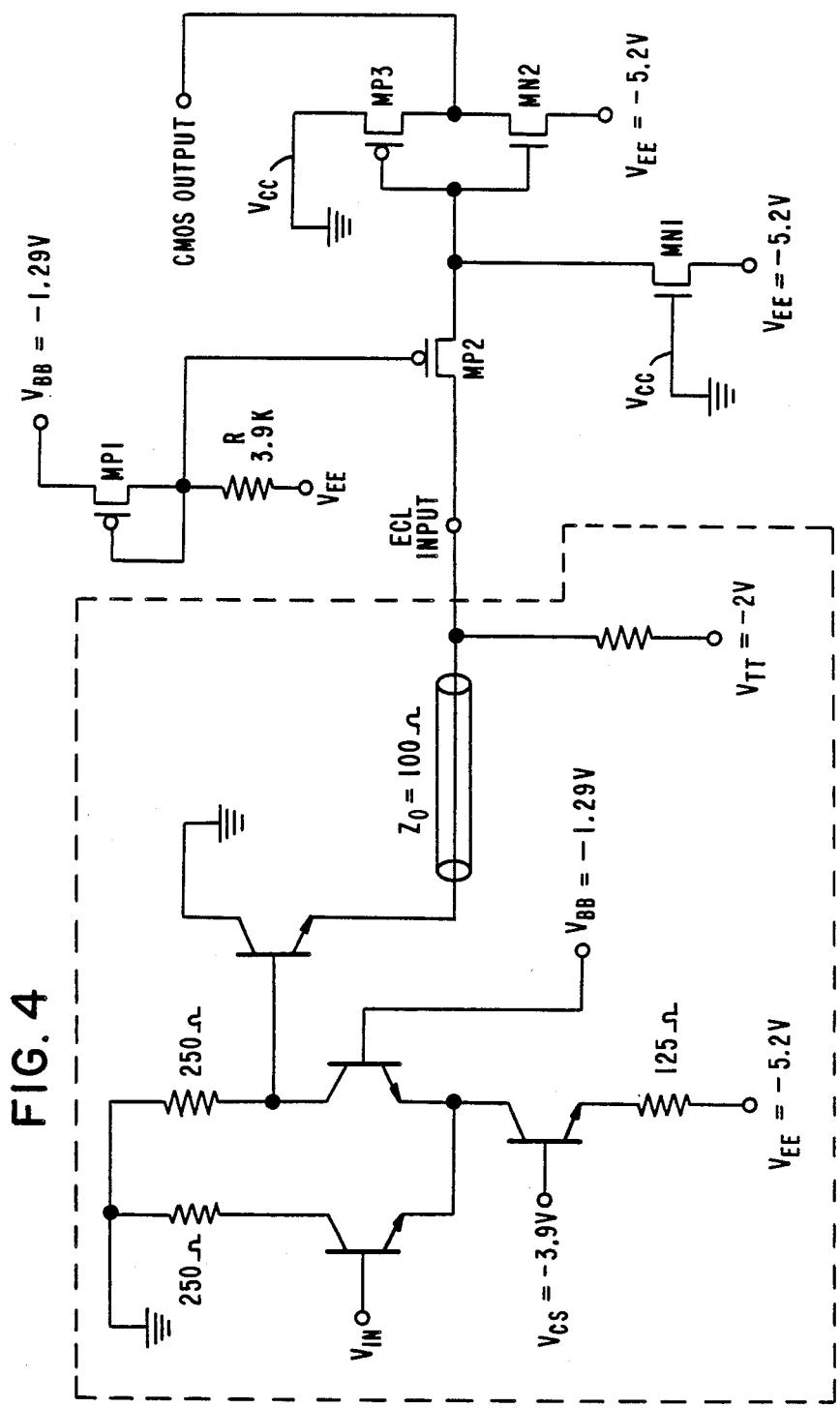
FIG. 4 is a schematic diagram illustrating the interconnection of the invention shown in FIG. 1 and a standard type of driver circuit used in a high speed system environment.

Referring now to FIG. 4, which is a schematic diagram illustrating the interconnection of the preferred embodiment of the invention shown in FIG. 1 and a standard type of driver circuit used in a high speed system environment where 50–100 ohm line drivers are used, the voltage VIN is directed to the base of a PNP transistor, which is connected in circuit as a differential (comparator) amplifier. The reference voltage, against which VIN is compared, is the voltage level VBB. The difference in the value of the voltage level between VBB and VIN is amplified and buffered by an NPN transistor driving a 100 ohm coaxial cable and a 100 ohm load which is connected to a −2 volt potential VTT The present invention, although particularly adapted to convert ECL logic levels to CMOS logic levels, may also be used to convert other signals of the same potential ranges.

While there has been shown and described what is considered to be the preferred embodiment of the invention, it will be manifest that many changes and modifications may be made therein without departing from the essential spirit and scope of the invention. It is intended, therefore, in the annexed claims to cover all such changes and modifications which fall within the true scope of the invention.

We claim:

1. An ECL to CMOS converter for converting ECL logic level signals to CMOS logic level signals comprised of:

a first MOS gate, of first conductivity type, having source, drain, and gate electrodes, the source electrode connected to receive ECL logic level signals;

a second MOS gate, of first conductivity type, having source, drain, and gate electrodes, the drain electrode connected to the gate electrode, the source electrode connected to a biasing voltage, and the drain and gate electrodes further connected to the gate electrode of said first MOS gate;

a first and a second power terminal having voltage levels thereat corresponding to high and low CMOS logic levels, respectively;

a current sink connected between the drain and gate electrodes of said second MOS gate and said second power terminal;

a third MOS gate, of second conductivity type, having source, drain, and gate electrodes, the drain electrode connected to the drain electrode of said first MOS gate, the source electrode connected to said second power terminal and the gate electrode connected to said first power terminal; and a complementary inverter circuit connected between said first and said second power terminals, said inverter circuit having an input connected to the drain of said first MOS gate, and an output for providing CMOS logic level signals in response to the ECL logic level signals at the source of said MOS gate.

2. An ECL to CMOS conveter, according to claim 1, wherein said current sink is comprised of:

a fourth MOS gate, of second conductivity type, having source, drain, and gate electrodes, the drain connected to the drain and gate of said second MOS gate, the source connected to said second power terminal;

fifth and sixth MOS gates, of second conductivity type, having source, drain, and gate electrodes, the gate and drain electrodes of said fifth MOS gate connected to the gate electrode of said fourth MOS gate, the drain and gate of said sixth MOS gate connected to the source of said fifth MOS gate, and the source of said sixth MOS gate connected to said second power terminal; and a seventh MOS gate, of first conductivity type, having source, drain, and gate electrodes, the gate electrode connected to said second power terminal, the source electrode connected to said first power terminal and the drain connected to the gate of said fourth MOS gate.

3. An ECL to CMOS converter, according to claim 1, wherein said current sink is comprised of a resistor connected between the drain electrode of said second MOS gate and said second power terminal.

4. An ECL to CMOS converter, according to claim 1, wherein said complementary inverter circuit is comprised of:

a P-channel MOS gate, having source, drain, and gate electrodes; and an N-channel MOS gate, having source, drain, and gate electrodes, the gate electrode connected to the gate electrode of said P-channel MOS gate and the drain of said first MOS gate, the drain and source of said P-channel and said N-channel MOS gates, respectively, connected together to provide an output, the source and drain of said P-channel and said N-channel MOS gates, respectively, connected to said first and said second power terminals, respectively.

5. An ECL to CMOS converter, according to claim 1, wherein the size of said first MOS gate is equal to the size of said second MOS gate.

6. An ECL to CMOS converter, according to claim 1, wherein the biasing voltage is fixed at one-half the sum of the voltage levels of the ECL low logic level signal and the ECL high logic level signal.

* * * * *